United States Patent
Suemasu

(10) Patent No.: US 7,999,178 B2
(45) Date of Patent: Aug. 16, 2011

(54) SOLAR CELL AND METHOD OF PRODUCING THE SAME

(75) Inventor: Takashi Suemasu, Tsukuba (JP)

(73) Assignee: Japan Science and Technology Agency, Kawaguchi-shi (JP)

(*) Notice: Subject to any disclaimer, the term of this patent is extended or adjusted under 35 U.S.C. 154(b) by 302 days.

(21) Appl. No.: 12/219,654

(22) Filed: Jul. 25, 2008

(65) Prior Publication Data
US 2009/0044862 A1    Feb. 19, 2009

(30) Foreign Application Priority Data

Aug. 10, 2006  (JP) .................... 2006-217948
Aug. 10, 2007  (JP) .................... 2007-208729

(51) Int. Cl.
*H01L 31/0264* (2006.01)
*H01L 31/18* (2006.01)
(52) U.S. Cl. ............... 136/261; 438/93; 257/E31.004
(58) Field of Classification Search .............. 136/261
See application file for complete search history.

(56) References Cited

U.S. PATENT DOCUMENTS 4,131,486 A * 12/1978 Brandhorst, Jr. ............. 136/255
4,765,845 A *  8/1988 Takada et al. ................. 136/258

FOREIGN PATENT DOCUMENTS

JP   2005294810 A  * 10/2005

OTHER PUBLICATIONS

McKee et al., "Molecular beam epitaxy of epitaxial barium silicide, barium oxide, and barium titanate on silicon," *Applied Physics Letters*, vol. 59, No. 7, Aug. 12, 1991, pp. 782-784.
McKee et al., "$BaSi_2$ and thin film alkaline earth silicides on silicon," *Applied Physics Letters*, vol. 63, No. 20 Nov. 15, 1993, pp. 2818-2820.
Nakamura et al., "Investigation of the energy band structure of orthorhombic $BaSi_2$ by optical and electrical measurements and theoretical calculations," *Applied Physics Letters*, vol. 81, No. 6, Aug. 5, 2002, pp. 1032-1034.
Morita et al., "Optical absorption of edge of ternary semiconducting silicide $ba_{1-x}Sr_xSi_2$," *Japanese Journal of Applied Physics*, vol. 45, No. 14, 2006, pp. L390-L392.
"Growth of BaSi2/CoSi2/Si(111) Structure by MEB and Characterization of the Same: Molecular beam epitaxy of $BaSi_2/CoSi_2/Si(111)$ hybrid structure," *Textbook for the 10th Summer School of Semiconducting Silicides*, pp. 71 and 71.

* cited by examiner

*Primary Examiner* — Jennifer K. Michener
*Assistant Examiner* — Matthew T Martin
(74) *Attorney, Agent, or Firm* — Fitch, Even, Tabin & Flannery

(57) ABSTRACT

A solar cell comprises a substrate; an n-type barium silicide layer being arranged on the substrate and containing Ba atoms and Si atoms; an $n^+$-type barium silicide layer being arranged on the n-type barium silicide layer and containing impurity atoms which are at least one of atoms belonging to Groups 13 to 15 of the periodic table, Ba atoms, and Si atoms; an upper electrode arranged on the $n^+$-type barium silicide layer; and a lower electrode arranged on the substrate.

23 Claims, 12 Drawing Sheets

SOLAR CELL AND METHOD OF PRODUCING THE SAME

CROSS-REFERENCE TO RELATED APPLICATIONS

This application is based on based on JP 2007-208729, filed Aug. 10, 2007, and JP 2006-217948, filed Aug. 10, 2006, the entire disclosures of which applications are hereby incorporated herein by reference.

BACKGROUND OF THE INVENTION

1. Field of the Invention

The present invention relates to a solar cell and a method for producing the same, in particular, to a solar cell using a barium silicide-based semiconductor and a method for producing the same.

2. Related Background Art

In 95% or above of conventional solar cells, semiconductors consisting of Si materials are used. However, Si has a forbidden band gap of 1.1 eV; therefore, conventional solar cells have not achieved sufficiently-high energy conversion efficiency. Moreover, having a small optical absorption coefficient, Si needs to be formed to have a thickness of 100 µm or above for photons to be absorbed sufficiently. Accordingly, such semiconductors are not suitable for the purpose of making thin solar cells.

There have been attempts to expand the forbidden band gap of silicon-based semiconductors in order to improve their energy conversion efficiency of the solar cells. In Japanese Unexamined Patent Application Publication No. 2005-294810, disclosed is a mixed crystal semiconductor thin film comprising $BaSi_2$ doped with alkaline earth metal atoms, such as Sr atoms, Ca atoms, or Mg atoms. It is disclosed that a mixed crystal semiconductor thin film doped with Sr atoms as alkaline earth metal atoms especially has a large optical absorption coefficient, and has a forbidden band gap of approximately 1.4 eV.

SUMMARY OF THE INVENTION

The present invention has been made in consideration of the above problems in the conventional techniques. An object of the present invention is to provide a silicon-based solar cell having a thin shape and high energy conversion efficiency.

The present inventor has earnestly studied in order to achieve the above object. As a result, the inventor has discovered that an electron density of a barium silicide-based semiconductor can be increased by doping the barium silicide-based semiconductor with specific atoms, and, as a result, a solar cell including this barium silicide-based semiconductor having a high electron density exhibits high energy conversion efficiency. This discovery has led the inventor to complete the present invention.

A solar cell of the present invention comprises a substrate; an n-type barium silicide layer being arranged on the substrate, and containing Ba atoms and Si atoms; an $n^+$-type barium silicide layer being arranged on the n-type barium silicide layer, and containing impurity atoms which are at least one of atoms belonging to Groups 13 to 15 of the periodic table, Ba atoms, and Si atoms; an upper electrode arranged on the $n^+$-type barium silicide layer; and a lower electrode arranged on the substrate.

The solar cell of the present invention preferably further comprises a metal silicide layer between the n-type barium silicide layer and the substrate, said metal silicide layer containing metal atoms which are at least one of atoms belonging to Groups 9 and 10 of the periodic table and Si atoms.

The lower electrode is preferably arranged on a surface of the metal silicide layer. The metal silicide layer is preferably a cobalt silicide layer containing Co atoms and Si atoms, or a nickel silicide layer containing Ni atoms and Si atoms.

It is preferable that the n-type barium silicide layer and/or the $n^+$-type barium silicide layer further contain alkaline earth metal atoms which are at least one atom selected from the group consisting of Sr atom, Ca atom, and Mg atom. The n-type barium silicide layer is preferably an epitaxial layer or a highly oriented layer.

The thickness of the n-type barium silicide layer is preferably in a range from 0.2 µm to 1.0 µm, and the thickness of the $n^+$-type barium silicide layer is preferably in a range from 0.01 µm to 0.1 µm.

A first method for producing a solar cell of the present invention includes the steps of: forming an n-type barium silicide layer by allowing Si atoms and Ba atoms to react with each other on a substrate; forming an $n^+$-type barium silicide layer on the surface of the n-type barium silicide layer by allowing impurity atoms which are at least one of atoms belonging to Groups 13 to 15 of the periodic table, Ba atoms, and Si atoms to react with each other; forming a lower electrode on the substrate; and forming an upper electrode on a surface of the $n^+$-type barium silicide layer.

In the first production method, it is preferable that at least one surface of the substrate is formed by Si, and that in the step of forming the n-type barium silicide layer, by introducing the Ba atoms into the Si surface of the substrate, the Si atoms and the Ba atoms be allowed to react with each other to form an n-type barium silicide ultrathin layer, and then Ba atoms and Si atoms be further allowed to react with each other on the n-type barium silicide ultrathin layer to form the n-type barium silicide layer.

A second method for producing a solar cell of the present invention includes the steps of: forming a metal silicide layer by allowing Si atoms and metal atoms belonging to Groups 9 and 10 of the periodic table to react with each other on a substrate; forming an n-type barium silicide layer by allowing Ba atoms and Si atoms to react with each other on the metal silicide layer; forming an $n^+$-type barium silicide layer on a surface of the n-type barium silicide layer by allowing impurity atoms which are at least one of atoms belonging to Groups 13 to 15 of the periodic table, Ba atoms, and Si atoms to react with each other; forming a lower electrode on at least one of the metal silicide layer and the substrate; and forming an upper electrode on a surface of the $n^+$-type barium silicide layer.

In the step of forming the n-type barium silicide layer in the second production method, it is preferable that a Si ultrathin layer be formed on a surface of the metal silicide layer, and then the Ba atoms be introduced into the Si ultrathin layer to allow the Ba atoms and the Si atoms to react with each other, and more preferable that, by introducing the Ba atoms into the Si ultrathin layer, the Si atoms and the Ba atoms be allowed to react with each other to form an n-type barium silicide ultrathin layer, and then Ba atoms and Si atoms be further allowed to react with each other on the n-type barium silicide ultrathin layer to form the n-type barium silicide layer.

In the step of forming the n-type barium silicide layer in the first and second production methods, it is preferable that alkaline earth metal atoms which are at least one atom selected from the group consisting of Sr atom, Ca atom, and Mg atom be additionally allowed to react.

In the step of forming the $n^+$-type barium silicide layer in the first and second production methods, it is preferable that alkaline earth metal atoms which are at least one atom selected from the group consisting of Sr atom, Ca atom, and Ma atom be additionally allowed to react.

In the first and second production methods, the n-type barium silicide layer is preferably formed by an epitaxy method.

In the first and second production methods, it is preferable that the n-type barium silicide layer be formed at a thickness of 0.2 μm to 1.0 μm, and the n$^+$-type barium silicide layer be formed at a thickness of 0.01 μm to 0.1 μm.

According to the present invention, it is possible to form a barium silicide-based n$^+$-type semiconductor having a high electron density and to obtain a silicon-based solar cell having a thin shape and high energy conversion efficiency.

DETAILED DESCRIPTION OF THE PREFERRED EMBODIMENTS

Figure 1:
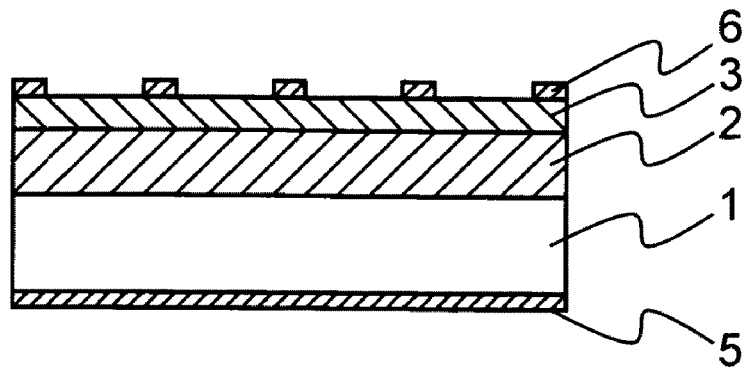
FIG. 1 is a cross-sectional view of a solar cell of the present invention.

A preferred embodiment of the present invention will be described below in detail with reference to drawings. Same or corresponding elements are indicated by same reference numerals and redundant descriptions will be omitted throughout the following descriptions and drawings.

Firstly, a solar cell of the present invention will be described. A solar cell of the present invention includes, as shown in FIG. 1 and FIG. 2, a substrate 1 (preferably having at least one surface formed by Si); an n-type barium silicide layer 2 being arranged on the substrate 1 (preferably on the Si surface thereof) and containing Ba atoms and Si atoms; an n$^+$-type barium silicide layer 3 being arranged on the n-type barium silicide layer 2 and containing impurity atoms which are at least one of atoms belonging to Groups 13 to 15 of the periodic table, Ba atoms, and Si atoms; an upper electrode 6 arranged on the n$^+$-type barium silicide layer 3; and a lower electrode 5 arranged on the substrate 1.

In the solar cell of the present invention, the n-type barium silicide layer 2 is preferably an epitaxial layer or a highly oriented layer. When the n-type barium silicide layer 2 is either an epitaxial layer or a highly oriented layer, it is possible to obtain a solar cell having higher energy conversion efficiency.

Figure 2:
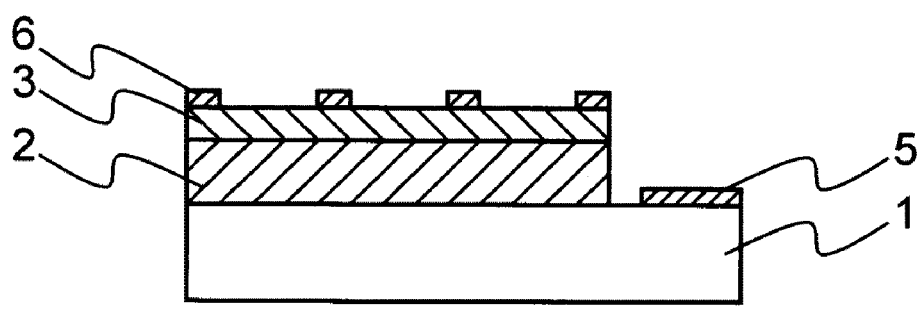
FIG. 2 is a cross-sectional view of a solar cell of the present invention.

As long as the lower electrode 5 is arranged on the substrate 1 so as to be connected electrically to the n-type barium silicide layer 2, the lower electrode 5 may be arranged, for example, as shown in FIG. 1, on the opposite surface of the surface of the substrate 1 on which the n-type barium silicide layer 2 is arranged, or may be arranged, as shown in FIG. 2, on the surface of the substrate 1 on which the n-type barium silicide layer 2 is arranged. Further, the lower electrode 5 may be arranged on both surfaces of the substrate 1.

In the present invention, "n-type" semiconductors denote those having an electron density of less than $1\times10^{18}$ cm$^{-3}$, while "n$^+$-type" semiconductors denote those having an electron density of $1\times10^{18}$ cm$^{-3}$ or above. The barium silicide related to the present invention can be exemplified by BaSi$_2$; however, it is not limited to one having an atomic ratio between barium and silicon (Ba:Si) of 1:2.

Figure 3:
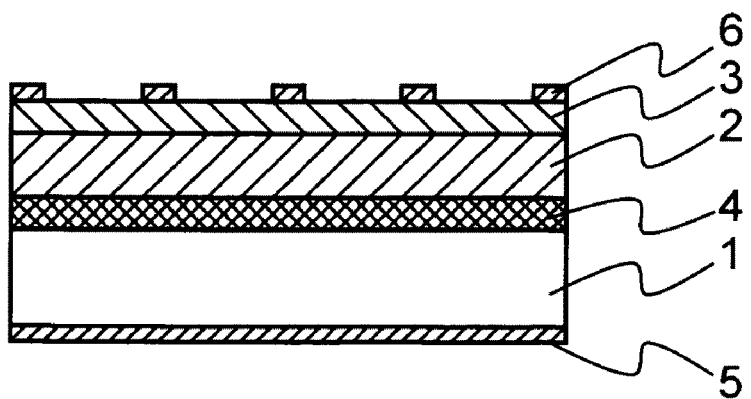
FIG. 3 is a cross-sectional view of a solar cell of the present invention.
Figure 4:
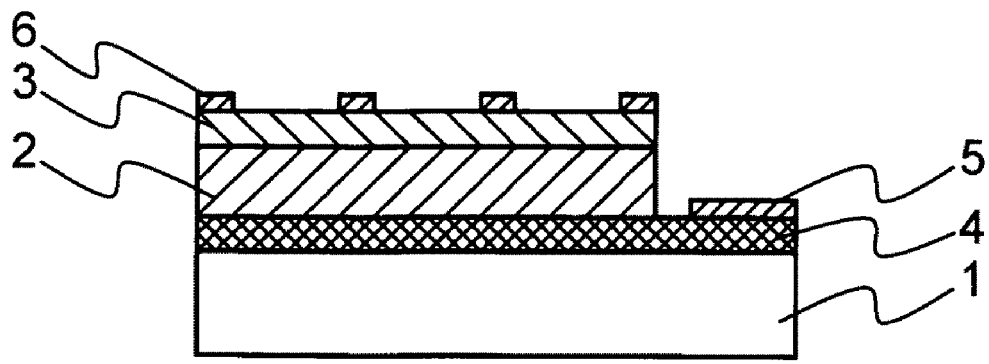
FIG. 4 is a cross-sectional view of a solar cell of the present invention.

The solar cell of the present invention preferably further includes, as shown in FIG. 3 and FIG. 4, a metal silicide layer 4 between the n-type barium silicide layer 2 and the substrate (preferably the Si surface thereof), wherein the metal silicide layer 4 contains metal atoms which are at least one of atoms belonging to Groups 9 and 10 of the periodic table and Si atoms. When the n-type barium silicide layer 2 is formed on the metal silicide layer 4, an n-type barium silicide layer 2 having good crystal quality can be formed, and the difference between the work function of the metal silicide and electron affinity of the barium silicide is large. Therefore, a solar cell having a high open voltage can be obtained.

In the solar cell of the present invention including the metal silicide layer 4, the lower electrode 5 is arranged on at least one of the metal silicide layer 4 and the substrate 1. For example, the lower electrode 5 may be arranged on the opposite surface of the surface of the substrate 1 on which the metal silicide layer 4 is arranged (FIG. 3), or may be arranged on the surface of the substrate 1 on which the metal silicide layer 4 is arranged (no drawing). Further, the lower electrode 5 may be arranged on the surface of the metal silicide layer 4 on which the n-type barium silicide layer 2 is arranged (FIG. 4), or may be arranged on the opposite surface of the surface of the metal silicide layer 4 on which the n-type barium silicide layer 2 is arranged (no drawing). Otherwise, the arrangement of the lower electrode 5 may be combination of these arrangements. Among these, from the perspective of reducing the total series resistance, including contact resistance with the electrodes, of the solar cell, the lower electrode 5 is preferably arranged on one surface of the metal silicide layer 4.

The solar cell of the present invention can be produced by, for example, the following method. In FIGS. 5A to 5D, cross-sectional views of solar cell members or a solar cell which are obtained at the end of respective steps in the following production method are shown respectively.

In a first method for producing the solar cell of the present invention, firstly, Si atoms and Ba atoms are allowed to react with each other on a substrate 1. The reaction of the Si atoms and the Ba atoms can be carried out, for example, by use of a substrate having at least one surface thereof formed by Si as the substrate 1, and by introducing the Ba atoms into at least one of the Si surface(s). However, the reaction of the Si atoms and the Ba atoms is not limited to this in the present invention. For example, it is also possible to allow the Si atoms and the Ba atoms to react with each other by introducing the Si atoms and the Ba atoms onto the substrate 1.

The substrate having at least one surface formed by Si may be entirely made of Si; however, it is preferably a substrate prepared by forming a Si layer on a surface of an inexpensive substrate, such as a glass substrate, from an economical point of view. Furthermore, the Si surface into which the Ba atoms will be introduced is more preferably a Si (111) surface in terms of being capable of forming an n-type barium silicide layer 2 having good crystal quality. Examples of methods of forming a (111)-oriented Si layer on a surface of a substrate, such as a glass substrate, include a method described by Oliver Nast and Stuart R. Wenham in Journal of Applied Physics, Vol. 88, 124 (2000). The introduced Ba atoms react with the Si atoms located in the vicinity of the Si surface, resulting in formation of an n-type barium silicide ultrathin layer. The thickness of this n-type barium silicide ultrathin layer is generally in a range from 10 nm to 20 nm.

As a method of introducing the Ba atoms, any publicly-known method of introducing atoms can be adopted; however, publicly-known epitaxy methods, such as a liquid-phase epitaxy method, a vapor-phase epitaxy method, and a molecular beam epitaxy method, are preferable. Among these, especially preferred is a method (Reactive Deposition Epitaxy method: RDE method) in which the Ba atoms are vapor-deposited onto the Si surface of the substrate 1 heated at 400° C. to 600° C. under ultrahigh vacuum (preferably in a range from 0.001 mPa to 0.01 mPa) so as to allow the Ba atoms and the Si atoms to react with each other and to grow epitaxially. By adopting this method, it is possible to obtain a crystal having less lattice defects. The vapor-deposition rate of Ba atom is preferably in a range from 1 nm/min to 2 nm/min.

In the first production method, the n-type barium silicide ultrathin layer may be used without modification as the n-type barium silicide layer 2, or a thick n-type barium silicide layer 2 may be formed by allowing Si atoms and Ba atoms to react with each other on the n-type barium silicide ultrathin layer. The thickness of the n-type barium silicide layer 2 is preferably in a range from 0.2 μm to 1.0 μm. If the thickness of the n-type barium silicide layer 2 falls below the lower limit, it tends to absorb sun light insufficiently. On the other hand, if the thickness exceeds the upper limit, a neutral region having no built-in electric field is present in the n-type barium silicide layer, and hence most of electron-hole pairs generated by light illumination tend to disappear due to recombination.

In the first production method, the n-type barium silicide layer 2 is preferably formed by epitaxial growth to be an epitaxial layer or a highly oriented layer. Examples of methods for epitaxial growth include publicly-known epitaxy methods, such as a liquid-phase epitaxy method, a vapor-phase epitaxy method, and a molecular beam epitaxy method. Among these, preferred is a method (molecular beam epitaxy method: MBE method) in which the Ba atoms and the Si atoms are simultaneously irradiated and vapor-deposited directly onto the n-type barium silicide ultrathin layer heated at 400° C. to 600° C. under ultrahigh vacuum (preferably in a range from 0.001 mPa to 0.01 mPa) so as to allow the Ba atoms and the Si atoms to react with each other. By adopting this method, it is possible to obtain a crystal having less lattice defects. The ratio of vapor-deposition rates of the respective atoms (Ba:Si) is preferably 1.0 to 2.0 nm/min: 0.5 to 1.0 nm/min.

In the first production method, the n-type barium silicide layer 2 preferably contains alkaline earth metal atoms which are at least one atom selected from the group consisting of Sr atom, Ca atom, and Mg atom. When the n-type barium silicide layer 2 contains such alkaline earth metal atoms, it is possible to expand a forbidden band gap of the n-type barium silicide layer 2; therefore, a solar cell having superior energy conversion efficiency can be obtained.

The content of the alkaline earth metal atoms to 1 mol of the Ba atom in the n-type barium silicide layer 2 is preferably approximately 1 mol. If the content of the alkaline earth metal atoms falls below the lower limit, the forbidden band gap tends not to expand to a value (1.4 eV) appropriate for a solar cell. On the other hand, if the content exceeds the upper limit, crystal quality of the n-type barium silicide layer 2 tends to deteriorate.

Examples of methods of causing the n-type barium silicide layer 2 to contain such alkaline earth metal atoms include a method in which the alkaline earth metal atoms in addition to the Ba atoms and the Si atoms are simultaneously irradiated and vapor-deposited in the epitaxial growth, and allowed to react with each other to grow epitaxially. The ratio of vapor-deposition rates of the respective atoms (Ba:Si:alkaline earth metal) is preferably 1.0 to 2.0 nm/min: 0.5 to 1.0 nm/min: 1.0 to 2.0 nm/min.

Figure 5A:
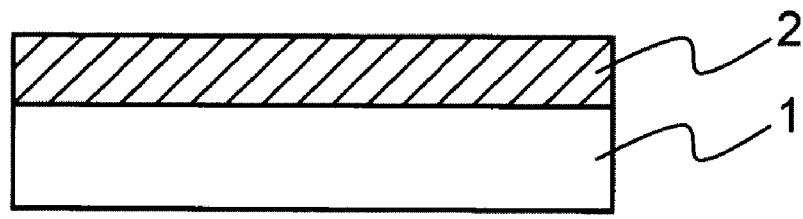
FIG. 5A is a cross-sectional view of a member for a solar cell (a solar cell member) obtained in a step of forming an n-type barium silicide layer.

FIG. 5A is a cross-sectional view of a solar cell member comprising the n-type barium silicide layer 2 thus obtained on the substrate 1.

Next, an $n^+$-type barium silicide layer 3 is formed on the surface of this n-type barium silicide layer 2 by allowing impurity atoms which are at least one of atoms belonging to Groups 13 to 15 of the periodic table, Ba atoms, and Si atoms to react with each other. By doping a barium silicide layer with the impurity atoms, it is possible to form an $n^+$-type barium silicide layer 3 having a higher electron density. Accordingly, since contact resistance between the electrodes and the solar cell is small, a solar cell of which a decrease in energy conversion efficiency due to series resistance is inhibited can be obtained. From this perspective, Sb atoms or Ga atoms are preferably doped.

The content of the impurity atoms to 1 mol of the Si atom in the $n^+$-type barium silicide layer 3 is preferably in a range from 0.1 mmol to 3 mmol, and more preferably in a range from 1 mmol to 3 mmol. If the content of the impurity atoms falls below the lower limit, contact resistance between the electrodes and the solar cell tends to be larger. On the other hand, the content exceeds the upper limit, crystal quality of the $n^+$-type barium silicide layer 3 tends to deteriorate.

The thickness of the $n^+$-type barium silicide layer 3 is preferably in a range from 0.01 µm to 0.1 µm. If the thickness of the $n^+$-type barium silicide layer 3 falls under the lower limit, contact resistance between the electrodes and the solar cell tends to be larger. On the other hand, the thickness exceeds the upper limit, sun light is reflected on the surface of the solar cell; therefore, the energy conversion efficiency tends to be decreased.

Examples of doping methods of the impurity atoms include a method in which impurity atoms which are at least one of atoms belonging to Groups 13 to 15 of the periodic table, the Ba atoms, and the Si atoms are vapor-deposited onto the surface of the n-type barium silicide layer 2. Especially preferred is a method in which the Ba atoms, the Si atoms, and the impurity atoms are directly and simultaneously irradiated and vapor-deposited onto the n-type barium silicide layer 2 heated at 400° C. to 600° C. under ultrahigh vacuum (preferably in a range from 0.001 mPa to 0.01 mPa) so as to allow them to react with each other. By adopting this method, a crystal having less lattice defects can be obtained. The ratio of vapor-deposition rates of the respective atoms (Ba: Si: impurity) is preferably 1.0 to 2.0 nm/min: 0.5 to 1.0 nm/min: 0.0001 to 0.001 nm/min.

In the first production method, the $n^+$-type barium silicide layer 3 preferably contains alkaline earth metal atoms which are at least one atom selected from the group consisting of Sr atom, Ca atom, and Mg atom. When the $n^+$-type barium silicide layer 3 contains such alkaline earth metal atoms, the forbidden band gap of the $n^+$-type barium silicide layer 3 can be expanded; therefore, a solar cell having superior energy conversion efficiency can be obtained.

The content of such alkaline earth metal atoms to 1 mol of the Ba atom in the $n^+$-type barium silicide layer 3 is preferably approximately 1 mol. If the content of the alkaline earth metal atoms falls below the lower limit, the forbidden band gap tends not to expand to a value (1.4 eV) appropriate for a solar cell. On the other hand, if the content exceeds the upper limit, crystal quality of the $n^+$-type barium silicide layer 3 tends to deteriorate.

Examples of methods of causing the $n^+$-type barium silicide layer 3 to contain the alkaline earth metal atoms include a method in which, when the Ba atoms, the Si atoms, and the impurity atoms are vapor-deposited, the alkaline earth metal atoms in addition to these atoms are simultaneously irradiated and vapor-deposited so as to allow the Ba atoms, the Si atoms, the impurity atoms, and the alkaline earth metal atoms to react with each other. The ratio of vapor-deposition rates of the respective atoms (Ba:Si:impurity:alkaline earth metal) is preferably 1.0 to 2.0 nm/min:0.5 to 1.0 nm/min:0.0001 to 0.001 nm/min:1.0 to 2.0 nm/min.

Figure 5B:
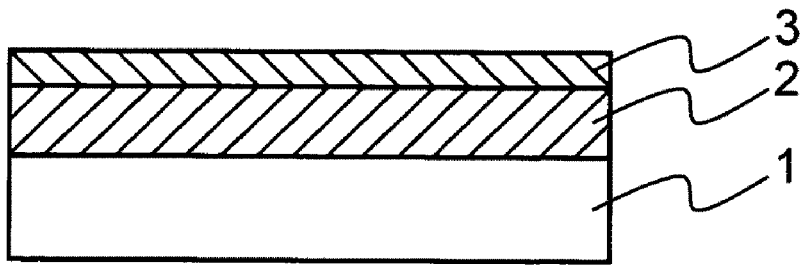
FIG. 5B is a cross-sectional view of a member for a solar cell (a solar cell member) obtained in a step of forming an n$^+$-type barium silicide layer.

FIG. 5B is a cross sectional view of a solar cell member comprising the n-type barium silicide layer 2 and the $n^+$-type barium silicide layer 3 which are thus obtained on the substrate 1.

Figure 5C:
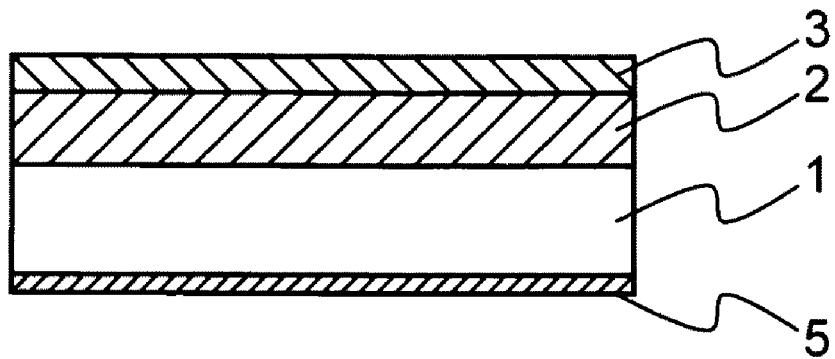
FIG. 5C is a cross-sectional view of a member for a solar cell (a solar cell member) obtained in a step of forming a lower electrode.
Figure 5D:
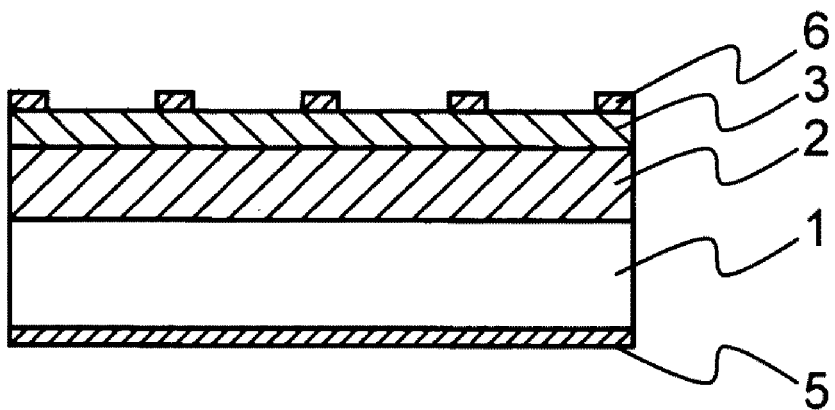
FIG. 5D is a cross-sectional view of a solar cell obtained in a step of forming an upper electrode.

Subsequently, electrodes are formed in this solar cell member in accordance of a publicly-known method. To be more specific, a lower electrode 5 is formed on the substrate 1 of the solar cell member so as to be connected electrically to the n-type barium silicide layer 2, and an upper electrode 6 is formed on the surface of the $n^+$-type barium silicide layer 3. These electrodes can be formed in any order. FIG. 5C is a cross-sectional view of a solar cell member having the lower electrode 5 on the opposite surface of the surface of the substrate 1 on which the n-type barium silicide layer 2 is arranged. FIG. 5D is a cross sectional view of a solar cell of the present invention comprising the lower electrode 5 on the opposite surface of the surface of the substrate 1 on which the n-type barium silicide layer 2 is arranged. As shown in FIG. 2, the lower electrode 5 may be formed on the surface of the substrate 1 on which the n-type barium silicide layer 2 is arranged. As the upper electrode 6 and the lower electrode 5, metal electrodes, such as a silver electrode, used in publicly-known solar cells are preferable.

Furthermore, in the case where the solar cell of the present invention comprises the metal silicide layer as shown in FIG. 3 and FIG. 4, the solar cell can be produced in accordance with the following method, for example. FIGS. 6A to 6F are cross-sectional views of solar cell members or a solar cell which are obtained at the end of respective steps in the following production method.

In a second method for producing the solar cell of the present invention, firstly, Si atoms and metal atoms belonging to Groups 9 to 10 of the periodic table are allowed to react with each other on a substrate 1. The reaction between the Si atoms and the metal atoms can be carried out, for example, by use of a substrate having at least one surface thereof formed by Si as the substrate 1, by introducing the metal atoms belonging to Groups 9 to 10 of the periodic table into at least one of the Si surface(s). However, the reaction between the Si atoms and the metal atoms is not limited to this in the present invention. For example, it is also possible to allow the Si atoms and the metal atoms belonging to Groups 9 to 10 of the periodic table to react with each other by introducing both of these atoms onto the substrate 1.

The substrate having at least one surface thereof formed by Si may be entirely made of Si; however, it is preferably a substrate prepared by forming a Si layer on a surface of an inexpensive substrate, such as a glass substrate, from an economical point of view. Furthermore, the Si surface into which the metal atoms are introduced is more preferably a Si (111) surface. When the metal atoms are introduced into the Si (111) surface, it is possible to form a metal silicide layer 4 having good crystal quality, and to further form an n-type barium silicide layer 2 having good crystal quality. The introduced metal atoms react with the Si atoms located in the vicinity of the Si surface, resulting in formation of a metal silicide layer 4.

When the metal silicide layer 4 is formed on the substrate 1 (preferably on the Si surface thereof) as described above, crystal quality of an n-type barium silicide layer 2 to be formed on the metal silicide layer 4 is improved. Moreover, the difference between the work function of the metal silicide and electron affinity of barium silicide is large. Therefore, a solar cell having a high open voltage can be obtained. In addition, from this perspective, among such metal silicide, the metal silicide having a lattice constant which is similar to that of the barium silicide is preferable, a cobalt silicide and a nickel silicide are more preferable, and a cobalt silicide is especially preferable. The cobalt silicide related to the present invention can be exemplified by $CoSi_2$; however, it is not limited to one having an atomic ratio between cobalt and silicon (Co:Si) of 1:2. In the meantime, the nickel silicide can be exemplified by $NiSi_2$; however, it is not limited to one having an atomic ratio between nickel and silicon (Ni:Si) of 1:2.

The thickness of the metal silicide layer 4 is preferably in a range from 10 nm to 40 nm. If the thickness of the metal silicide layer 4 falls below the lower limit, the resistance of the metal silicide becomes large. Accordingly, the energy conversion efficiency of the solar cell tends to be decreased. On the other hand, if the thickness exceeds the upper limit, crystal quality of the metal silicide deteriorates, and crystal quality of the n-type barium silicide layer 2 located thereabove tends to deteriorate.

As a method of introducing the metal atoms, any publicly-known method of introducing atoms can be adopted; however, publicly-known epitaxy methods, such as a liquid-phase epitaxy method, a vapor-phase epitaxy method, and a molecular beam epitaxy method, are preferable. Among these, especially preferred is a method (Reactive Deposition Epitaxy method: RDE method) in which the metal atoms are vapor-deposited onto the Si surface of the substrate 1 under ultrahigh vacuum (preferably in a range from 0.001 mPa to 0.01 mPa) at room temperature, and the metal atoms and the Si atoms are allowed to react with each other by, for example, annealing at 600° C. to 700° C. for 5 minutes to grow epitaxially. By adopting this method, a crystal having less lattice defects can be obtained. The vapor-deposition rate of the metal atoms is preferably 1 nm/min to 2 nm/min.

Figure 6A:
FIG. 6A is a cross-sectional view of a member for a solar cell (a solar cell member) obtained in a step of forming a metal silicide layer.

FIG. 6A is a cross-sectional view of a solar cell member having the metal silicide layer 4 thus obtained on the substrate 1.

Next, an n-type barium silicide layer 2 is formed by allowing Ba atoms and Si atoms to react with each other on the metal silicide layer 4. In this case, for example, a Si ultrathin layer 2a is formed on the surface of the metal silicide layer 4, and then a crystalline n-type barium silicide layer 2 can be formed on the metal silicide layer 4 by forming a barium silicide layer, which will be described later, by use of this Si ultrathin layer 2a as a template. However, the formation of the n-type barium silicide layer 2 is not limited to this in the present invention. For example, the n-type barium silicide layer 2 can be formed by introducing the Ba atoms and the Si atoms onto the surface of the metal silicide layer 4. Among these, the former method in which the Si ultrathin layer 2a is formed is preferable, from perspective of being capable of easily forming the n-type barium silicide layer 2.

The thickness of the Si ultrathin layer 2a is preferably in a range from 10 nm to 15 nm. If the thickness of the Si ultrathin layer 2a falls below the lower limit, an n-type barium silicide ultrathin layer, which will be described later, tends to be thin. On the other hand, if the thickness exceeds the upper limit, the n-type barium silicide ultrathin layer tends to be thick whereby crystal quality tends to deteriorate.

As a method of forming the Si ultrathin layer 2a, any publicly-known method of forming a Si ultrathin layer can be adopted; however, publicly-known epitaxy methods, such as a liquid-phase epitaxy method, a vapor-phase epitaxy method, and a molecular beam epitaxy method, are preferable. Among these, more preferred is a method (Molecular Beam Epitaxy method: MBE method) in which the Si atoms are directly irradiated and vapor-deposited onto the metal silicide layer 4 heated at 500° C. to 600° C. under ultrahigh vacuum (preferably in a range from 0.001 mPa to 0.01 mPa) and thereby deposited. By adopting this method, a crystal having less lattice defects can be obtained. The vapor-deposition rate of the Si atoms is preferably in a range from 0.5 nm/min to 1.0 nm/min.

Figure 6B:
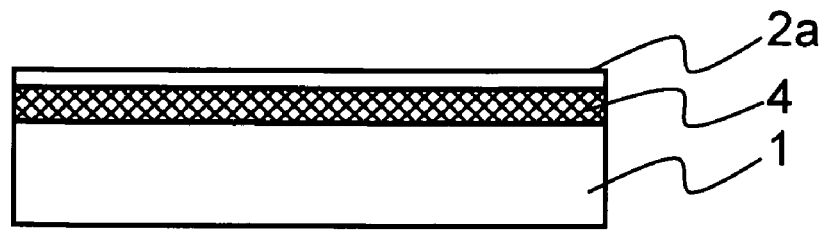
FIG. 6B is a cross-sectional view of a member for a solar cell (a solar cell member) obtained in a step of forming a Si ultrathin layer.

FIG. 6B is a cross-sectional view of a solar cell member having the Si ultrathin layer 2a and the metal silicide layer 4 which are thus obtained on the substrate 1.

Subsequently, Ba atoms are introduced into this Si ultrathin layer 2a. The introduced Ba atoms react with Si atoms in the Si ultrathin layer 2a, resulting in formation of an n-type barium silicide ultrathin layer. The thickness of this n-type barium silicide ultrathin layer is preferably in a range from 10 nm to 20 nm. As a method of introducing Ba atoms, a method similar to that in the first production method is preferable. In terms of being able to obtain a crystal having less lattice defects, a Reactive Deposition Epitaxy method (RDE method) is more preferable.

In the second production method similarly to the case of the first production method, the n-type barium silicide ultrathin layer may be used without modification as an n-type barium silicide layer 2, or a thick n-type barium silicide layer 2 may be formed by allowing Si atoms and Ba atoms to react with each other on the n-type barium silicide ultrathin layer. In the second production method, the n-type barium silicide layer 2 is also preferably formed by epitaxial growth to be an epitaxial layer or a highly oriented layer. The thickness of the n-type barium silicide layer 2, a method of epitaxial growth, and the content of alkaline earth metal atoms are similar to those in the case of the first production method.

Figure 6C:
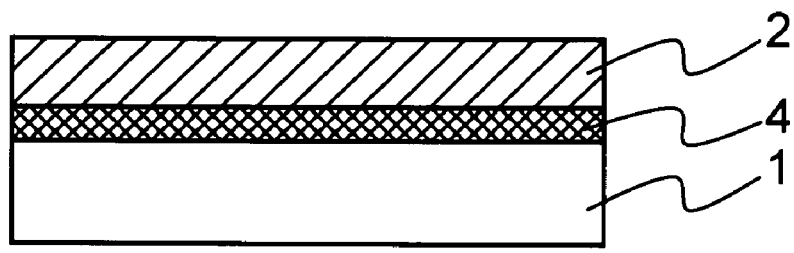
FIG. 6C is a cross-sectional view of a member for a solar cell (a solar cell member) obtained in a step of forming an n-type barium silicide layer.

FIG. 6C is a cross-sectional view of a solar cell member having the metal silicide layer 4 and the n-type barium silicide layer 2 which are thus obtained on the substrate 1.

Next, from the perspective similar to the case of the first production method, an $n^+$-type barium silicide layer 3 containing impurity atoms which are at least one of atoms belonging to Groups 13 to 15 of the periodic table, Ba atoms, and Si atoms, is formed on the surface of the n-type barium silicide layer 2. The content of the impurity atoms in the $n^+$-type barium silicide layer 3, the thickness thereof, a doping method of the impurity atoms, and the content of alkaline earth metal atoms are similar to those in the case of the first production method.

Figure 6D:
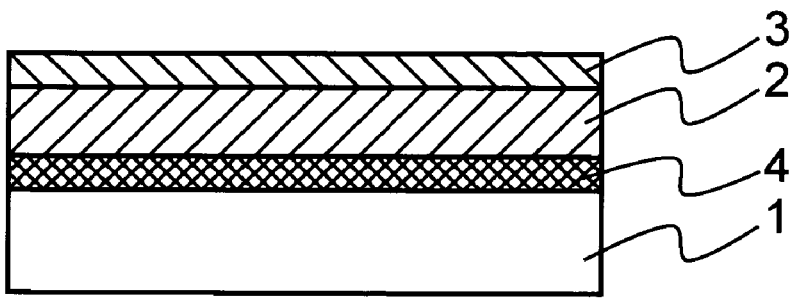
FIG. 6D is a cross-sectional view of a member for a solar cell (a solar cell member) obtained in a step of forming an n$^+$-type barium silicide layer.

FIG. 6D is a cross-sectional view of a solar cell member having the metal silicide layer 4, the n-type barium silicide layer 2, and the $n^+$-type barium silicide layer 3 which are thus obtained on the substrate 1.

Figure 6E:
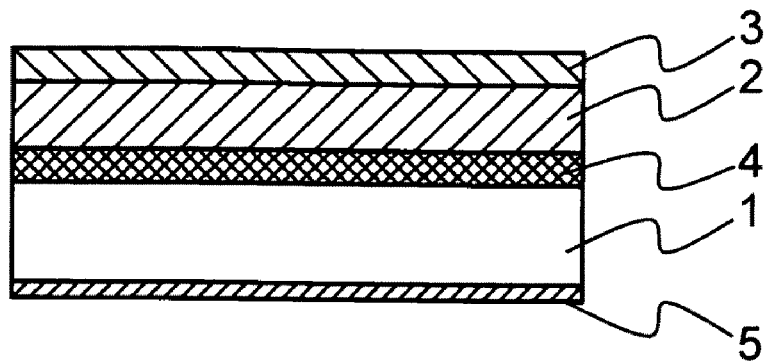
FIG. 6E is a cross-sectional view of a member for a solar cell (a solar cell member) obtained in a step of forming a lower electrode.
Figure 6F:
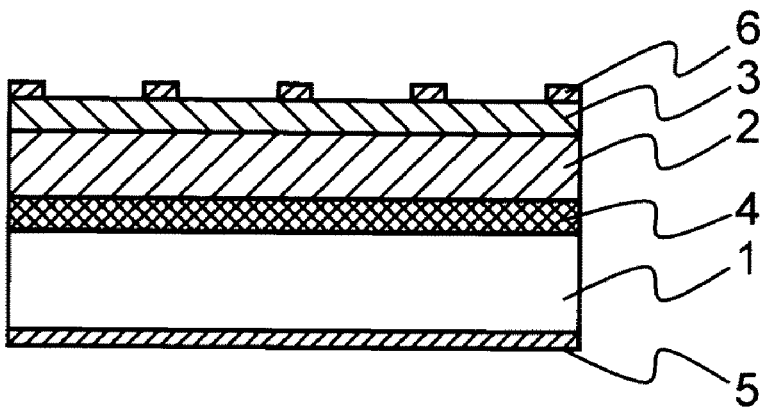
FIG. 6F is a cross-sectional view of a solar cell obtained in a step of forming an upper electrode.

Thereafter, electrodes are formed in this solar cell member similarly to the case of the first production method. An upper electrode 6 is formed on the surface of the $n^+$-type barium silicide layer 3, and a lower electrode 5 is formed on at least one of the metal silicide layer 4 and the substrate 1 so as to be connected electrically to the metal silicide layer 4. These electrodes can be formed in any order. FIG. 6E is a cross-sectional view of a solar cell member having the lower electrode 5 on the opposite surface of the surface of the substrate 1 on which the metal silicide layer 4 is arranged, and FIG. 6F is a cross-sectional view of a solar cell of the present invention comprising the lower electrode 5 on the opposite surface of the surface of the substrate 1 on which the metal silicide layer 4 is arranged. The lower electrode 5 may be formed on the surface of the substrate 1 on which the metal silicide layer 4 is arranged (no drawing), or formed on the surface of the metal silicide layer 4 on which the n-type barium silicide layer 2 is arranged (FIG. 4), or formed on the opposite surface of the surface of the metal silicide layer 4 on which the n-type barium silicide layer 2 is arranged (no drawing). As the upper electrode 6 and the lower electrode 5, metal electrodes, such as a silver electrode, used in publicly-known solar cells are preferable.

Since the solar cell of the present invention thus obtained has the n+-type barium silicide layer 3 having a higher electron density, which is formed on the n-type barium silicide layer 2, contact resistance with the electrodes is small. Accordingly, it is possible to inhibit a decrease in energy conversion efficiency due to series resistance. Furthermore, since a barium silicide has a high optical absorption coefficient (100 times that of Si), it is possible to absorb sufficient sun light even when the thicknesses of the n-type barium silicide layer 2 and the n+-type barium silicide layer 3 are reduced. Moreover, by reducing the thicknesses thereof, the amount of Si can be reduced; therefore, large build-in potential can be applied throughout the whole light absorption region. In addition, including the n-type barium silicide layer 2 having high crystal quality and a low lattice defect density, the solar cell of the present invention can attain large built-in potential in a Schottky junction formed between the substrate 1 (preferably on the Si surface thereof) or the metal silicide layer 4 and the n-type barium silicide layer 2. These configurations contribute to superior energy conversion efficiency of the solar cell of the present invention.

EXAMPLE

The present invention will be described in detail on the basis of Example; however, the present invention is not limited to the following Example. Characteristics of obtained solar cell members were evaluated in accordance with the following methods.

(1) Reflection High-Energy Electron Diffraction (RHEED)

Surface crystal structures after forming the respective layers of a solar cell member were observed by a reflection high-energy electron diffraction apparatus (made by ANELVA Corporation, model: VT-580-017).

(2) X-ray Diffraction (XRD)

Crystal structure of a solar cell member was observed by use of an X-ray diffractometer (RINT2000 series made by Rigaku Corporation).

(3) Conductivity Type and Carrier Density

Conductivity type and carrier density were evaluated by Hall measurement. Measurement was carried out at room temperature by using R6240A made by Advantest Corporation as a current source, R6441D made by Advantest Corporation as a voltmeter, and a direct-current power source made by Denshijiki Industry Co., Ltd. as a magnetic field generating source.

(4) Current-Voltage Characteristics (Dark-Current Characteristics)

Bias voltages from −9 V to +9 V were applied to a cobalt silicide layer of an obtained solar cell with respect to an n+-type barium silicide layer by using a curve tracer (made by Kikusui Electronics Corporation, model: 5802) at room temperature, and the amount of current flowing was measured by using the curve tracer.

Example 1

Figure 7:
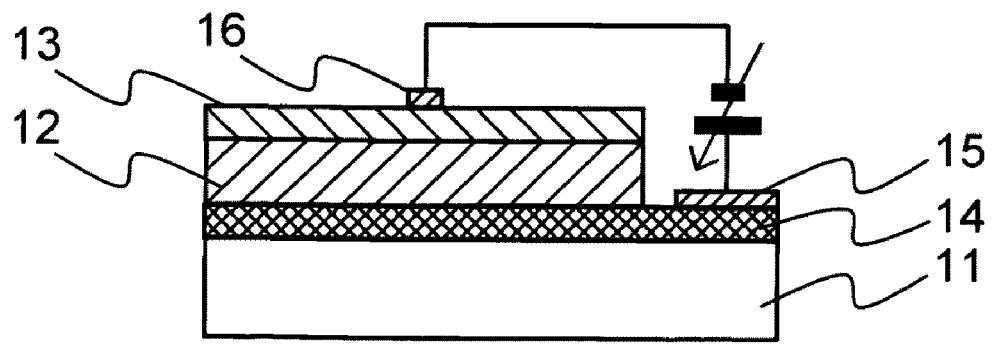
FIG. 7 is a cross-sectional view of a solar cell produced in Example.
Figure 8:
FIG. 8 is a photograph showing a state of a crystal structure of a layer surface observed by a RHEED method on a solar cell member obtained after formation of a cobalt silicide layer, which was produced in Example.

A solar cell having a cross-sectional structure shown in FIG. 7 was produced. A molecular beam epitaxy system (made by RIBER, model: MBE-2300) was used for crystal growth. Firstly, a p-type Si substrate 11 was heated at 850° C. for 30 minutes in an ultrahigh vacuum chamber (at 0.0001 mPa) to remove an oxidized film on the substrate surface. As a result, a Si (111) clean surface was obtained. Next, by vapor-depositing Co atoms onto the Si (111) clean surface at a room temperature and a vapor-deposition rate of 2 nm/min, a Co layer having a thickness of 7 nm was formed on the Si substrate 11. This substrate was subjected to annealing treatment at 700° C. for 5 minutes to allow the Co atoms and Si atoms to react with each other. As a result, a cobalt silicide layer 14 having a thickness of 20 nm was formed on the Si substrate 11. The RHEED pattern of the solar cell member after the formation of the cobalt silicide layer 14 is shown in FIG. 8.

Figure 9:
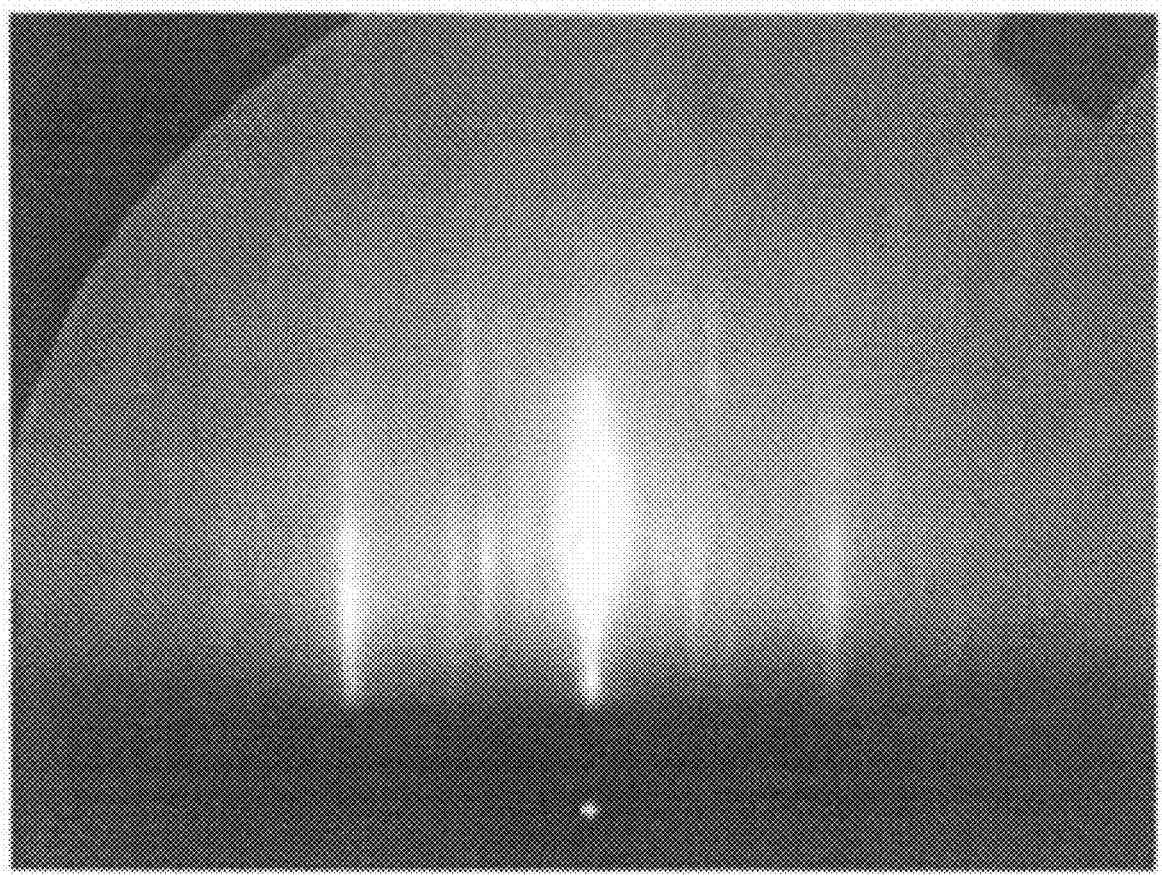
FIG. 9 is a photograph showing a state of a crystal structure of a layer surface observed by the RHEED method on a solar cell member obtained after formation of a Si ultrathin layer, which was produced in Example.

Subsequently, while the solar cell member having the cobalt silicide layer 14 was heated at 590° C., Si atoms were vapor-deposited onto the surface of the cobalt silicide layer 14 at a vapor-deposition rate of 1 nm/min. As a result, a Si ultrathin layer having a thickness of 10 nm was formed on the cobalt silicide layer 14. The RHEED pattern of the solar cell member after the formation of the Si ultrathin layer is shown in FIG. 9.

Figure 10:
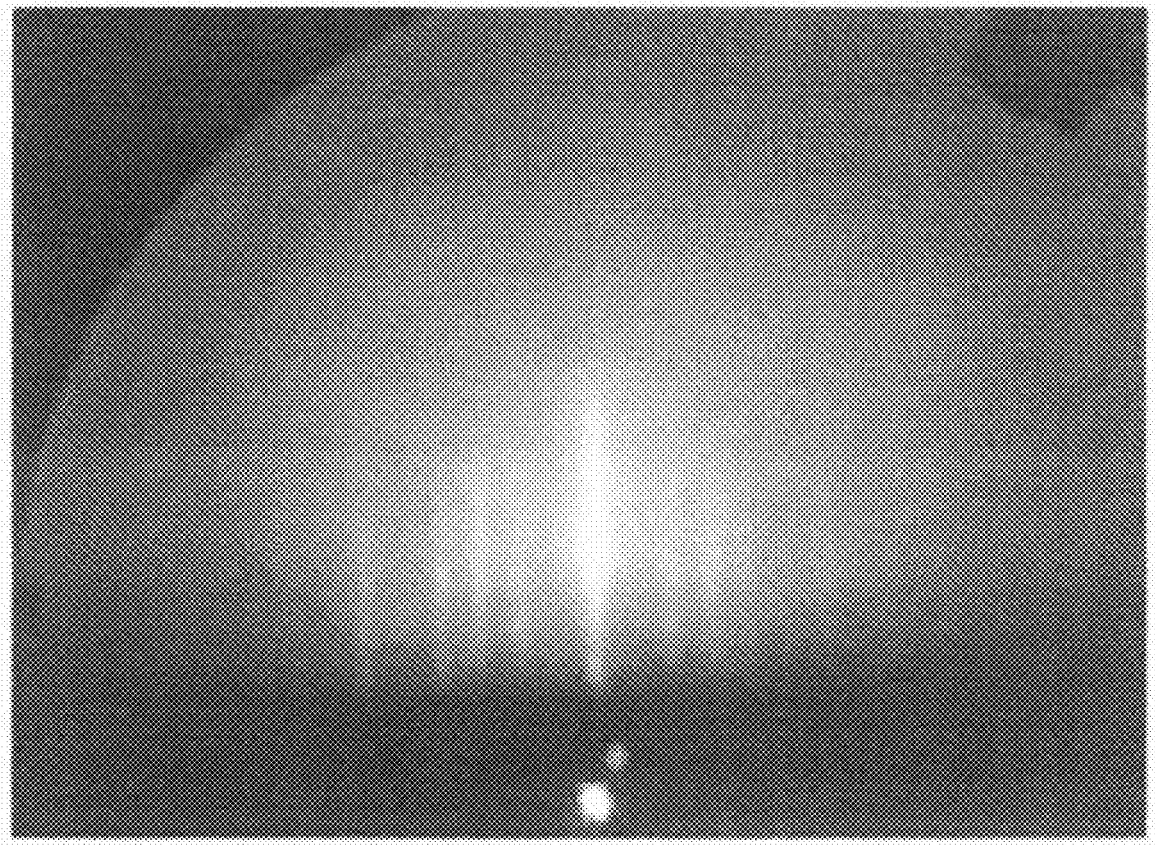
FIG. 10 is a photograph showing a state of a crystal structure of a layer surface observed by the RHEED method on a solar cell member obtained after formation of an n-type barium silicide ultrathin layer, which was produced in Example.

Next, while the solar cell member having the Si ultrathin layer was heated at 550° C., Ba atoms were vapor-deposited onto the surface of the Si ultrathin layer at a vapor-deposition rate of 1.5 nm/min, and by allowing the Ba atoms and Si atoms to react with each other, a barium silicide ultrathin layer having a thickness of 20 nm was formed on the cobalt silicide layer 14. The conductivity type and electron density of this barium silicide ultrathin layer were measured by the Hall measurement, and found to be n-type and $8 \times 10^{15}$ cm$^{-3}$, respectively. The RHEED pattern of the solar cell member after the formation of the n-type barium silicide ultrathin layer is shown in FIG. 10.

Figure 11:
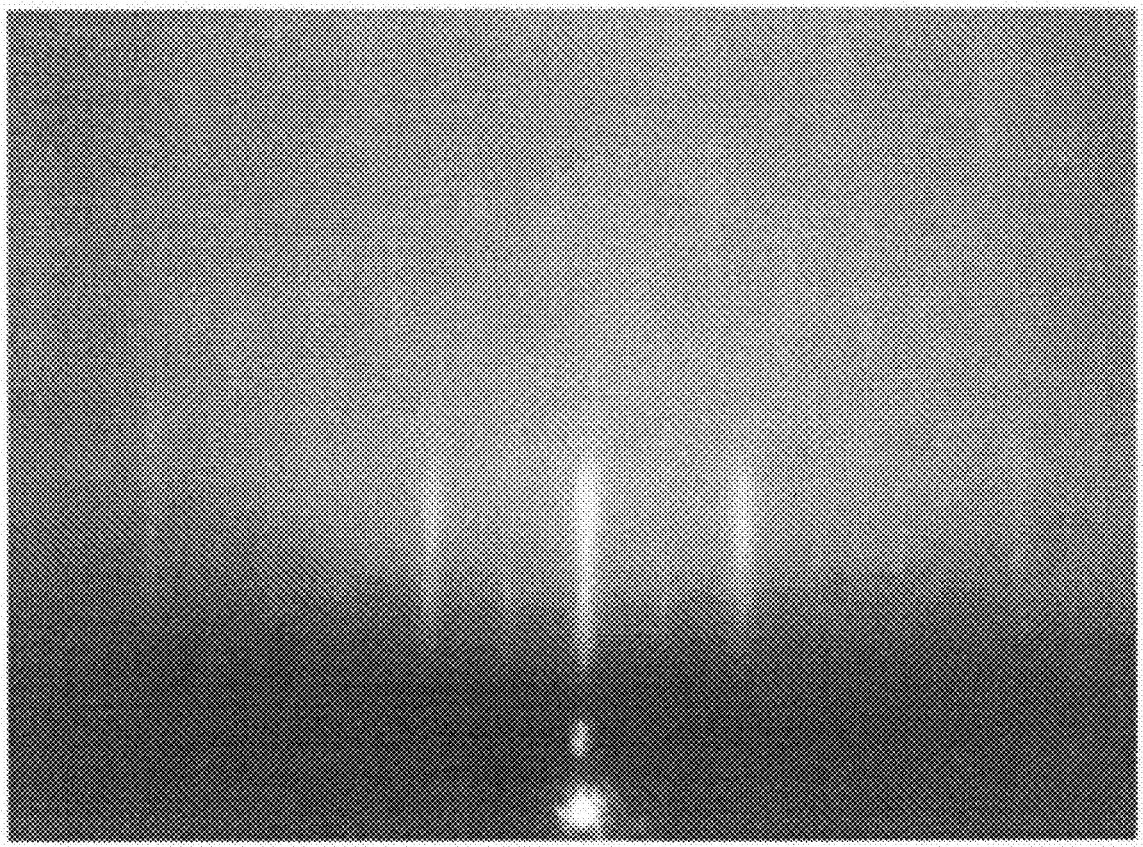
FIG. 11 is a photograph showing a state of a crystal structure of a layer surface observed by the RHEED method on a solar cell member obtained after formation of an n-type barium silicide layer, which was produced in Example.

Next, a barium silicide layer was grown by use of the n-type barium silicide ultrathin layer as a template. To be more specific, while the solar cell member having the n-type barium silicide ultrathin layer was heated at 600° C., Ba atoms (at a vapor-deposition rate of 1.5 nm/min) and Si atoms (at a vapor-deposition rate of 0.8 nm/min) were simultaneously vapor-deposited onto the surface of the n-type barium silicide ultrathin layer. Then, by allowing the Ba atoms and the Si atoms to react with each other, a barium silicide layer having a thickness of 200 nm was formed on the cobalt silicide layer 14. The conductivity type and electron density of this barium silicide layer were measured by the Hall measurement, and found to be n-type and $5 \times 10^{15}$ cm$^{-3}$, respectively. The RHEED pattern of the solar cell member after the formation of the n-type barium silicide layer 12 is shown in FIG. 11.

Figure 12:
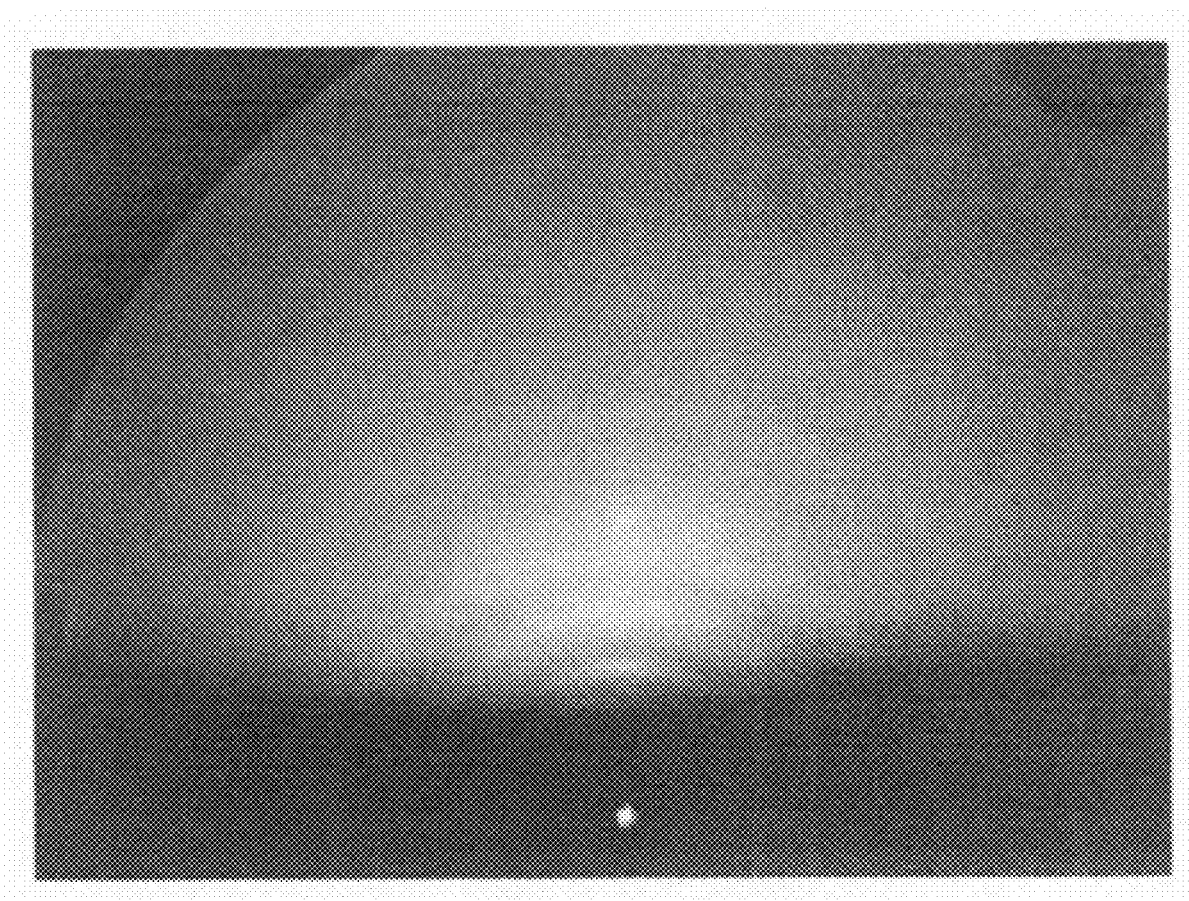
FIG. 12 is a photograph showing a state of a crystal structure of a layer surface observed by the RHEED method on a solar cell member obtained after formation of an n$^+$-type barium silicide layer, which was produced in Example.
Figure 13:
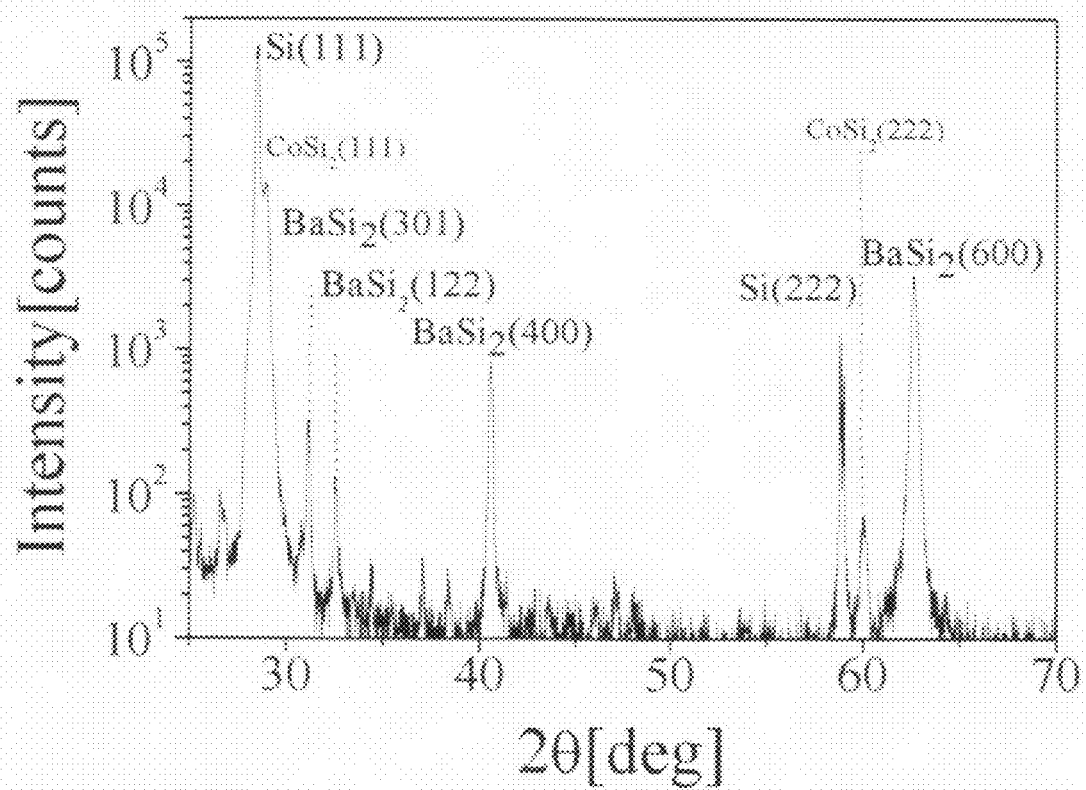
FIG. 13 is a graph showing an X-ray diffraction pattern of the solar cell member produced in Example.

Next, while the solar cell member having the n-type barium silicide layer 12 was heated at 600° C., Ba atoms (at a vapor-deposition rate of 1.5 nm/min), Si atoms (at a vapor-deposition rate of 0.8 nm/min), and Sb atoms (at a vapor-deposition rate of 0.001 nm/min) were simultaneously vapor-deposited onto the surface of the n-type barium silicide layer 12. Then, by allowing the Ba atoms, the Si atoms, and the Sb atoms to react with each other, a Sb-doped barium silicide layer having a thickness of 20 nm was formed on the n-type barium silicide layer 12. The conductivity type and electron density of the Sb-doped barium silicide layer were measured by the Hall measurement, and found to be n+ type and $5 \times 10^{19}$ cm$^{-3}$, respectively. The RHEED pattern of the solar cell member after the formation of the n+-type barium silicide layer 13 is shown in FIG. 12. The X-ray diffraction pattern of the solar cell member after the formation of the n+-type barium silicide layer 13 is shown in FIG. 13.

Thereafter, a lower electrode 15 and an upper electrode 16 were formed, as shown in FIG. 7, by silver paste on the surface of the cobalt silicide layer 14 and the surface of the n+-type barium silicide layer 13, respectively, of a solar cell member having the n$^+$-type barium silicide layer 13, and thereby a solar cell of the present invention was obtained. Dark-current characteristics of this solar cell were measured at room temperature. The result is shown in FIG. 14.

As described above, the electron density of the n$^+$-type barium silicide layer was $5 \times 10^{19}$ cm$^{-3}$. Therefore, it was confirmed that the n$^+$-type barium silicide layer having a high electron density was formed by doping the barium silicide layer with Sb atoms. Furthermore, all the RHEED patterns of the cobalt silicide layer, the Si ultrathin layer, the n-type barium silicide ultrathin layer, and the n-type barium silicide layer were streak patterns as shown in FIG. 8 to FIG. 11, and high a-axis orientation was observed in a θ-2θ X-ray diffraction measurement as shown in FIG. 13. Based on these, these layers were confirmed to be formed by epitaxial growth. On the other hand, the RHEED pattern of the n$^+$-type barium silicide layer was a ring pattern as shown in FIG. 12, and distortion of a-axis orientation was observed in the θ-2θ X-ray diffraction measurement as shown in FIG. 13. Therefore, this layer was confirmed to be polycrystal.

Figure 14:
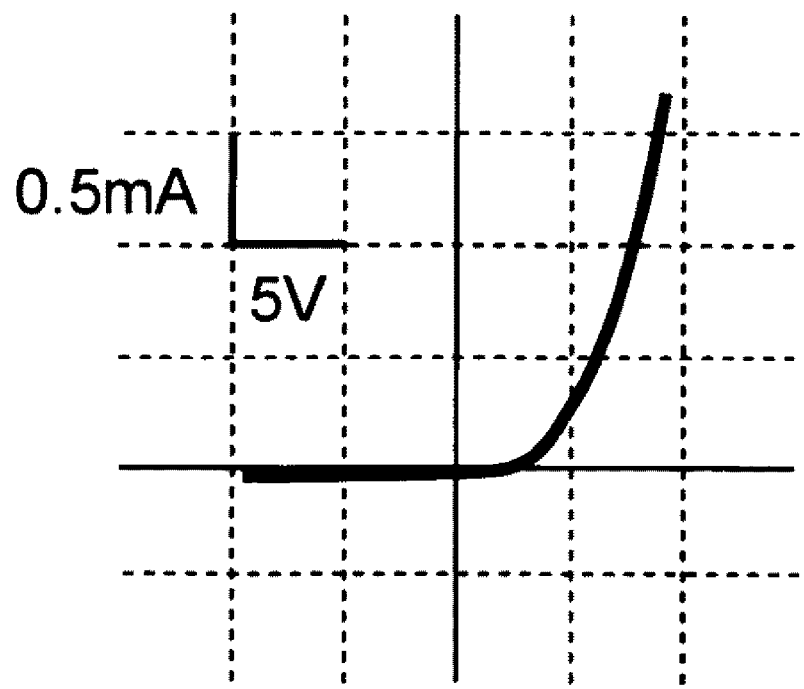
FIG. 14 is a graph showing dark-current characteristics of the solar cell produced in Example.

The dark-current characteristics of the solar cell having such a crystal structure, as shown in FIG. 14, show clear rectifying properties with a large current under forward bias condition (positive bias on the cobalt silicide layer), and a smaller current under reverse bias condition (negative bias on the cobalt silicide layer). Hence, it was confirmed that the solar cell of the present invention is effective as one having high energy conversion efficiency.

As described above, according to the present invention, a barium silicide-based semiconductor having a high electron density can be formed by doping a barium silicide-based semiconductor having a high optical absorption coefficient with impurity atoms which are at least one of atoms belonging to Groups 13 to 15 of the periodic table.

Hence, having a large optical absorption coefficient and high energy conversion efficiency, the solar cell of the present invention is useful as a thin solar cell and the like.

What is claimed is:

1. A solar cell, comprising:
   a substrate;
   an n-type barium silicide layer arranged on the substrate, and containing Ba atoms and Si atoms; an n$^+$-type barium silicide layer arranged on the n-type barium silicide layer, and containing Ba atoms, Si atoms, and impurity atoms which are at least one of Sb atoms and Ga atoms;
   an upper electrode arranged on the n$^+$-type barium silicide layer; and
   a lower electrode arranged on the substrate.

2. The solar cell according to claim 1, further comprising a metal silicide layer between the n-type barium silicide layer and the substrate, said metal silicide layer containing metal atoms which are at least one of atoms belonging to Groups 9 and 10 of the periodic table and Si atoms.

3. The solar cell according to claim 2, wherein the lower electrode is arranged on a surface of the metal silicide layer.

4. The solar cell according to claim 2, wherein the metal silicide layer is any one of a cobalt silicide layer containing Co atoms and Si atoms, and a nickel silicide layer containing Ni atoms and Si atoms.

5. The solar cell according to claim 1, wherein at least one of the n-type barium silicide layer and the n$^+$-type barium silicide layer further contain alkaline earth metal atoms which are at least one atom selected from the group consisting of Sr atom, Ca atom, and Mg atom.

6. The solar cell according to claim 1, wherein the n-type barium silicide layer is any one of an epitaxial layer and a highly oriented layer.

7. The solar cell according to claim 1, wherein the thickness of the n-type barium silicide layer is in a range from 0.2 µm to 1.0 µm, and the thickness of the n$^+$-type barium silicide layer is in a range from 0.01 µm to 0.1 µm.

8. A method for producing a solar cell, comprising the steps of:
   forming an n-type barium silicide layer by allowing Si atoms and Ba atoms to react with each other on a substrate;
   forming an n$^+$-type barium silicide layer on a surface of the n-type barium silicide layer by allowing Ba atoms, Si atoms, and impurity atoms which are at least one of Sb atoms and Ga atoms to react with each other;
   forming a lower electrode on the substrate; and
   forming an upper electrode on a surface of the n$^+$-type barium silicide layer.

9. The method for producing a solar cell according to claim 8, wherein at least one surface of the substrate is formed by Si, and, in the step of forming the n-type barium silicide layer, by introducing the Ba atoms into the Si surface of the substrate, the Si atoms and the Ba atoms are allowed to react with each other to form an n-type barium silicide ultrathin layer, and then Ba atoms and Si atoms are further allowed to react with each other on the n-type barium silicide ultrathin layer to form the n-type barium silicide layer.

10. The method for producing a solar cell according to claim 8, wherein, in the step of forming the n-type barium silicide layer, alkaline earth metal atoms which are at least one atom selected from the group consisting of Sr atom, Ca atom, and Mg atom is additionally allowed to react.

11. The method for producing a solar cell according to claim 8, wherein, in the step of forming the n$^+$-type barium silicide layer, alkaline earth metal atoms which are at least one atom selected from the group consisting of Sr atom, Ca atom, and Mg atom is are additionally allowed to react.

12. The method for producing a solar cell according to claim 8, wherein the n-type barium silicide layer is formed by an epitaxy method.

13. The method for producing a solar cell according to claim 8, wherein the thickness of the n-type barium silicide layer is in a range from 0.2 µm to 1.0 µm, and the thickness of the n$^+$-type barium silicide layer is in a range from 0.01 µm to 0.1 µm.

14. A method for producing a solar cell, comprising the steps of:
   forming a metal silicide layer by allowing Si atoms and metal atoms belonging to Groups 9 and 10 of the periodic table to react with each other on a substrate;
   forming an n-type barium silicide layer by allowing Ba atoms and Si atoms to react with each other on the metal silicide layer;
   forming an n$^+$-type barium silicide layer on a surface of the n-type barium silicide layer by allowing Ba atoms, Si atoms, and impurity atoms which are at least one of Sb atoms and Ga atoms, to react with each other;
   forming a lower electrode on at least one of the metal silicide layer and the substrate; and forming an upper electrode on a surface of the n$^+$-type silicide layer.

15. The method for producing a solar cell according to claim 14, wherein, in the step of forming the n-type barium silicide layer, a Si ultrathin layer is formed on a surface of the metal silicide layer, and then the Ba atoms are introduced into the Si ultrathin layer to allow the Ba atoms and the Si atoms to react with each other.

16. The method for producing a solar cell according to claim 15, wherein, in the step of forming the n-type barium silicide layer, by introducing the Ba atoms into the Si ultrathin layer, the Si atoms and the Ba atoms are allowed to react with each other to form an n-type barium silicide ultrathin layer, and then Ba atoms and Si atoms are further allowed to react with each other on the n-type barium silicide ultrathin layer to form the n-type barium silicide layer.

17. The method for producing a solar cell according to claim 14, wherein, in the step of forming the n-type barium silicide layer, alkaline earth metal atoms which are at least one atom selected from the group consisting of Sr atom, Ca atom, and Mg atom is additionally allowed to react.

18. The method for producing a solar cell according to claim 14, wherein, in the step of forming the $n^+$-type barium silicide layer, alkaline earth metal atoms which are at least one atom selected from the group consisting of Sr atom, Ca atom, and Mg atom is additionally allowed to react.

19. The method for producing a solar cell according to claim 14, wherein the n-type barium silicide layer is formed by an epitaxy method.

20. The method for producing a solar cell according to claim 14, wherein the thickness of the n-type barium silicide layer is in a range from 0.2 μm to 1.0 μm, and the thickness of the $n^+$-type barium silicide layer is in a range from 0.01 μm to 0.1 μm.

21. The solar cell according to claim 1, wherein the $n^+$-type barium silicide layer has an electron density of $5\times10^{19}$ $cm^{-3}$ or above.

22. The method for producing a solar cell according to claim 8, wherein the $n^+$-type barium silicide layer has an electron density of $5\times10^{19}$ $cm^{-3}$ or above.

23. The method for producing a solar cell according to claim 14, wherein the $n^+$-type barium silicide layer has an electron density of $5\times10^{19}$ $cm^{-3}$ or above.

* * * * *